United States Patent
Brumley, Jr. et al.

(10) Patent No.: US 12,194,885 B2
(45) Date of Patent: *Jan. 14, 2025

(54) BATTERY WITH BATTERY MANAGEMENT SYSTEM FOR ENGINE START APPLICATIONS

(71) Applicant: Deltran Operations USA, Inc., DeLand, FL (US)

(72) Inventors: Edward William Brumley, Jr., Port Orange, FL (US); Peter James Shread, Celebration, FL (US)

(73) Assignee: Deltran Operations USA, Inc., Deland, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/407,339

(22) Filed: Jan. 8, 2024

(65) Prior Publication Data

US 2024/0198855 A1 Jun. 20, 2024

Related U.S. Application Data

(63) Continuation of application No. 17/175,014, filed on Feb. 12, 2021, now Pat. No. 11,865,944.

(Continued)

(51) Int. Cl.
*B60L 58/22* (2019.01)
*B60L 58/15* (2019.01)
(Continued)

(52) U.S. Cl.
CPC ............... *B60L 58/22* (2019.02); *B60L 58/15* (2019.02); *G01R 31/3842* (2019.01); *G01R 31/396* (2019.01); *H01M 10/4257* (2013.01); *H01M 10/441* (2013.01); *H01M 10/482* (2013.01); *H02J 7/0019* (2013.01); *H02J 7/00308* (2020.01); *H02J 7/0048* (2020.01); *H02J 7/007* (2013.01); *B60L 2250/12* (2013.01); *B60L 2250/30* (2013.01); *H01M 2010/4271* (2013.01); *H01M 2010/4278* (2013.01)

(58) Field of Classification Search
CPC ...... B60L 58/22; B60L 58/15; H02J 7/00308; H02J 7/0048; H02J 7/0019; H02J 7/007; H01M 10/4257; H01M 10/441; H01M 10/482
USPC ........................................... 320/109
See application file for complete search history.

(56) References Cited

U.S. PATENT DOCUMENTS

2010/0052614 A1* 3/2010 Mariels ................. H02J 7/0016 320/164
2017/0302090 A1* 10/2017 Han ..................... H02J 7/00308

* cited by examiner

*Primary Examiner* — Nathaniel R Pelton
(74) *Attorney, Agent, or Firm* — Greenberg Traurig, LLP; Michael K. Dixon

(57) ABSTRACT

A battery management system for batteries, such as, but not limited to, electric vehicle battery packs and cells, lithium iron phosphate batteries, lead acid batteries, gel batteries, and absorbed gel mat batteries, in engine start applications is disclosed. The battery management system is configured to control the charge and charging of each cell individually. The battery management system may be configured to control the charge of a battery which may consist of a plurality of cells, such as, but not limited to, lithium iron phosphate cells, and in at least one embodiment, the battery may consist of, but is not limited to being formed from, four lithium iron phosphate cells connected in series and a battery management system to ensure proper charge and safe operation.

16 Claims, 15 Drawing Sheets

Related U.S. Application Data

(60) Provisional application No. 63/032,148, filed on May 29, 2020.

(51) Int. Cl.
*G01R 31/3842* (2019.01)
*G01R 31/396* (2019.01)
*H01M 10/42* (2006.01)
*H01M 10/44* (2006.01)
*H01M 10/48* (2006.01)
*H02J 7/00* (2006.01)

BATTERY WITH BATTERY MANAGEMENT SYSTEM FOR ENGINE START APPLICATIONS

This application claims the benefit of U.S. Provisional Patent Application No. 63/032,148, filed on May 29, 2020, and is a continuation application of U.S. patent application Ser. No. 17/175,014, filed on Feb. 12, 2021, which are incorporated herein in their entireties.

FIELD OF THE INVENTION

The invention relates to battery charging systems, and more particularly, to battery charging systems configured with engine start batteries and deep cycle batteries.

BACKGROUND

Lithium iron phosphate ($LiFePO_4$) batteries often include protection modes, such as Under Voltage Protection (UVP) mode and Over Voltage Protection (OVP) mode, to protect the batteries from being completely discharged and overcharged. During Under Voltage Protection mode, a control system of a lithium iron phosphate battery disconnects the cell pack from the battery posts to prevent further discharge. In the Under Voltage Protection mode, the control system disconnects the cell pack from the battery's posts, whereby the measured voltage across the posts is zero. In this mode, the battery may appear as if it is completely "dead". Automatic battery chargers do not detect such condition and are unable to charge the battery when in the Under Voltage Protection mode.

Similarly, when a lithium iron phosphate battery is in Over Voltage Protection (OVP) mode, the control system disconnects the cell pack from the battery posts to prevent overcharging. In this mode, there is no load on the charging system. When the battery is in such mode, an electrical system of a vehicle to which the battery is coupled often suffers improper operation, such as dash board lights flickering, check engine light, etc. Such problems do not typically occur with a conventional battery, such as lead acid, flooded, AGM, etc., which presents a constant load to a charging system regardless of the state of charge of the battery.

Additionally, a charging system can create excessive electrical potential and high current flow from the charging system. Charging systems can generate between about 12 Volts direct current to more than 20 Volts direct current at currents as high as 60 amps. Such high voltage and current can damage cells in lithium iron phosphate battery batteries.

Charging systems often do not produce clean direct current. Rather, charging systems may create a great deal of ripple, which may cause improper charging of the battery packs cells leading to shortened lifetimes and damage.

SUMMARY OF THE INVENTION

A battery management system for engine start applications, battery charging and deep cycle applications for batteries such as, but not limited to, electric vehicle battery packs and cells and battery chemistries, such as, but not limited to, lithium iron phosphate batteries, lead acid batteries, gel batteries, and absorbed gel mat batteries is disclosed. The battery management system is configured to control the charge and charging of each cell individually. The battery management system may be configured to control the charge of a battery which may consist of a plurality of cells, such as, but not limited to, lithium iron phosphate cells, and in at least one embodiment, the battery may consist of, but is not limited to being formed from, four lithium iron phosphate cells connected in series and a battery management system to ensure proper charge and safe operation. The battery management system may be configured to control the charge and charging of each cell individually and not control charging based only on the overall metrics of the battery as a whole, which is a sum total of each of the individual cells within the battery.

The battery management system may be configured to address the problems previously set forth as follows. The battery management system may include an under voltage protection mode to protect one or more cells, or an entire battery formed from a plurality of cells from losing too much voltage. Unlike conventional technology, the battery management system can enable a voltage to be present across the poles of a battery when the battery is in undervoltage protection mode to enable the battery voltage to be monitored. As such, the battery management system may be configured to allow a battery's voltage to be read while in under voltage protection mode while limiting current flow. Under voltage protection mode may also automatically clear once the battery charge is sufficient or may be cleared via direction from a user through a wireless or other communications interface. Under voltage protection mode may also automatically clear, such as being temporarily suspended, upon detection of an engine start attempt.

The battery management system may also be configured to protect one or more cells of a battery or the entire battery via an over voltage protection mode. In particular, the battery management system may be configured to continuously monitor each cell of a battery and start to discharge the cell when the cell approaches over voltage protection value. The battery management system may be configured to regulate the input voltage and current.

The battery management system may be configured for engine starts applications. In particular, the battery management system may be configured to replace cell banks with super capacitors or may be configured to be compatible with a combination of cell banks and super capacitors allowing for high instantaneous current draw events, such as, but not limited to engine starts. The battery management system may be configured to collect cells into pack banks, which may allow one or more packs to be discharged while the other packs are being charged and thus always maintaining a load on the charging system. The battery management system may be configured to integrate learning/filtering into the software to customize the reserve charge set aside for engine starts. The battery management system may include a battery charging system including one or more power source connections. The battery charging system may include one or more voltage regulators per battery cell.

The battery management system may include a controller configured to control voltage via under and over voltage protection modes and to charge each cell individually in a multicell battery. The battery management system may include precision voltage references for use as a direct comparison for under voltage protection and over voltage protection. The controller may be configured to sense whether an individual cell voltage is equal to or greater than an over voltage protection reference voltage. If the individual cell voltage is equal to or greater than the over voltage protection reference voltage, then the controller may engage the over voltage protection mode via opening a charging field effect transistor. The controller may be configured such that when the controller senses that an individual cell voltage is equal to or less than an under voltage protection reference voltage, the microcontroller may engage the under voltage protection mode via opening a discharging field effect transistor. In at least one embodiment, the controller is a microcontroller or other appropriate device.

The battery management system may include a voltage regulator for regulating input for the cell charging circuit to filter out input voltage ripple before it reaches the plurality of cells. The voltage regulator may be set to a charge voltage level, thereby allowing maximum loading on the external charging system. The voltage regulator may have operating modes including a constant current mode and a constant voltage mode. The voltage regulator may be in constant current mode when the cell voltage is less than the current voltage level. The battery management system may include a feedback loop measuring cell voltage to properly control the state of the regulator.

The battery management system may include a system control module configured to maintain the integrity of an electrical system, such as a vehicle electrical system, to which the battery management system is attached when the battery management system is in an over voltage mode. In particular, the system control module simulates a battery so that the electrical system, such as a vehicle electrical system, to which the battery management system is attached does not develop odd, explained errors and operating conditions when the battery management system is in an over voltage mode. The system control module may emulate the battery's impedance when measuring the voltage of each cell. The system control module of the battery management system may include a discharge field effect transistor and a battery impedance emulator circuit, wherein the cell voltage is measured with the discharge field effect transistor open and the battery impedance emulator circuit engaged, thereby maintaining a quieting load on the external charging system, which models a lead acid battery and a absorbent glass mat battery. The controller may implement hysteresis to prevent an oscillation of states in the feedback loop. The controller may use a voltage regulator to maintain maximum applied voltage while in constant current mode. Once cell voltage reaches a charge level voltage, the controller fixes a regulated voltage adjust entering constant voltage mode and remains in this mode until cell voltage level drops below the charge voltage level. The voltage regulator may be configured to accept input voltage within a range between 12 Volts direct current and 20 Volts direct current.

The battery management system may include a cell balancing system configured to compare cell performance and adjust cells with voltages misaligned from target voltages. The cell balancing system may include one or more discharge resistors and one or more voltage monitors on each cell.

The battery management system may include a communication system, which may be wireless or another design, enabling the battery management system to communicate with remote devices to transmit data regarding cell and cell pack characteristics. The communication system may enable inter-battery management system communications to facilitate parallel and series battery configurations. The battery management system may include an alert system for indicating operational features of the battery management system. The battery management system may include an input system configured to receive input to control aspects of the battery management system.

The controller may include an engine start mode in which the battery is discharged to the under voltage protection level and under voltage mode is engaged. The controller may disengage the under voltage protection mode for a specified window of time, referred to as an engine start window, thereby enabling an engine start to be attempted during the engine start window. The battery management system may include a battery impedance emulator to stabilize the battery management system when in over voltage protection mode.

An advantage of this system is that each cell of a battery, such as a lithium battery, may be individually analyzed and individually charged such that each cell may be fully charged thereby fully charging the battery as a whole.

Another advantage of this system is that when the battery management system is in over voltage protection mode, a filtering circuit is engaged which emulates a standard battery thereby eliminate electrical system malfunctions.

Yet another advantage of this system is that when the battery management system is in under voltage protection mode, the battery voltage is still detectable on the battery posts allowing smart chargers to automatically detect the battery and start charging the battery.

Another advantage of this system is that the battery management system is configured to regulate both voltage and current into a cell pack, thereby eliminating charging system instability which can damage cells.

Still another advantage of this system is that the battery management system is configured to detect smart battery chargers and provides a direct charging path for the cells for smart battery chargers, thereby allowing the smart battery charger to directly control charging.

These and other embodiments are described in more detail below.

DETAILED DESCRIPTION OF THE FIGURES

As shown in FIGS. 1-15, a battery management system 10 for engine start applications, battery charging and deep cycle applications for batteries such as, but not limited to, electric vehicle battery packs and cells and battery chemistries, such as, but not limited to, lithium iron phosphate batteries, lead acid batteries, gel batteries, and absorbed gel mat batteries is disclosed. The battery management system 10 may be configured to control the charge and charging of each cell on an individual cell basis. The battery management system 10 may be configured to control the charge of a battery 12 which may consist of a plurality of cells 13, such as, but not limited to, lithium iron phosphate cells, and in at least one embodiment, the battery 12 may consist of, but is not limited to being formed from, four lithium iron phosphate cells connected in series and a battery management system 10 to ensure proper charge and safe operation. The battery 12 may be removably coupled to the battery management system 10.

Figure 7:
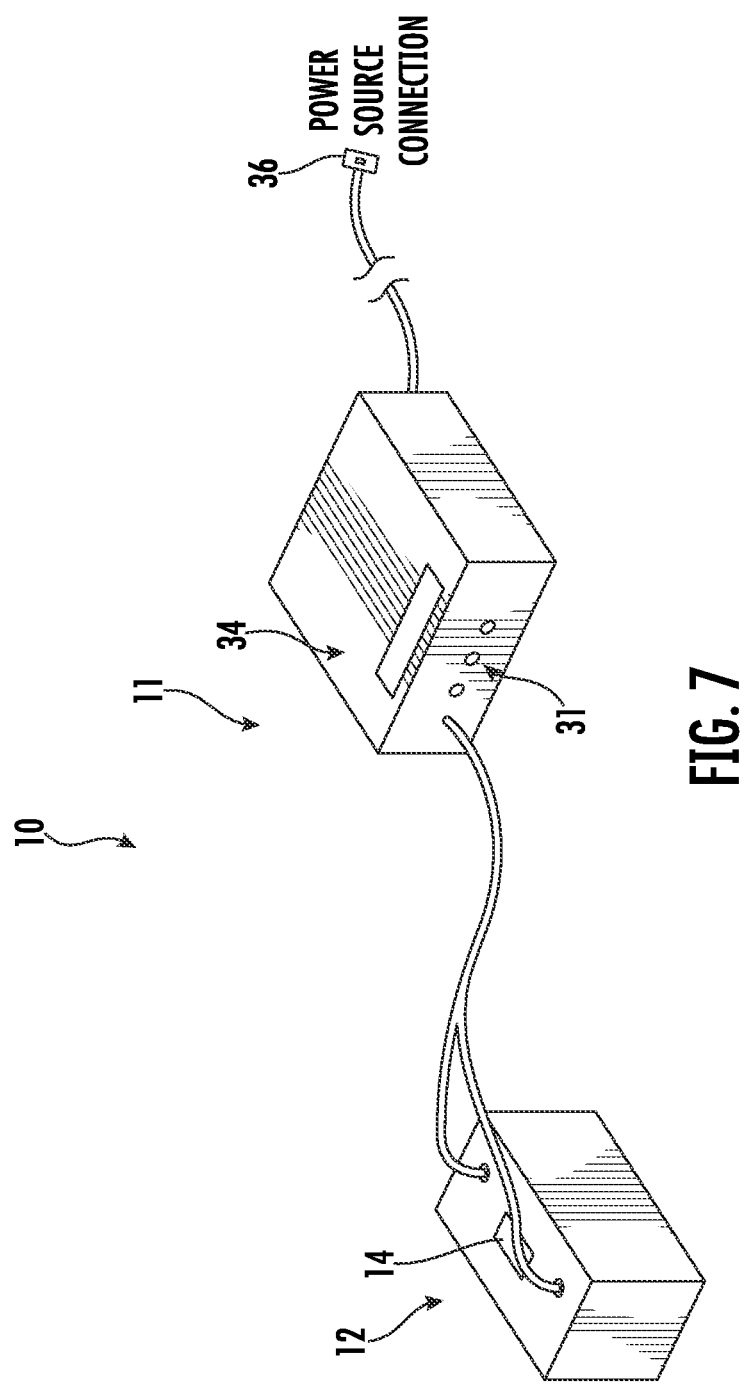
FIG. 7 is a perspective view of the battery management system including the battery charging system.

In at least one embodiment, the battery management system 10 may include a battery charging system 11 including one or more power source connections 36, as shown in FIG. 7, and one or more voltage monitors 18 per battery cell 13, as shown in FIGS. 1 and 3-5. The battery management system 10 may include one or more controllers 14 configured to control voltage and charging of each cell 13 individually in a multicell battery 12. The battery management system 10 may be formed from one or more printed circuit board assemblies (PCBA). The one or more printed circuit board assemblies may implement embodiments, such as, but not limited to, the configurations shown in FIGS. 1 and 3-6 and described herein. The one or more printed circuit board assemblies may enable a system integrator to customize a battery 12 and other components.

Figure 10:
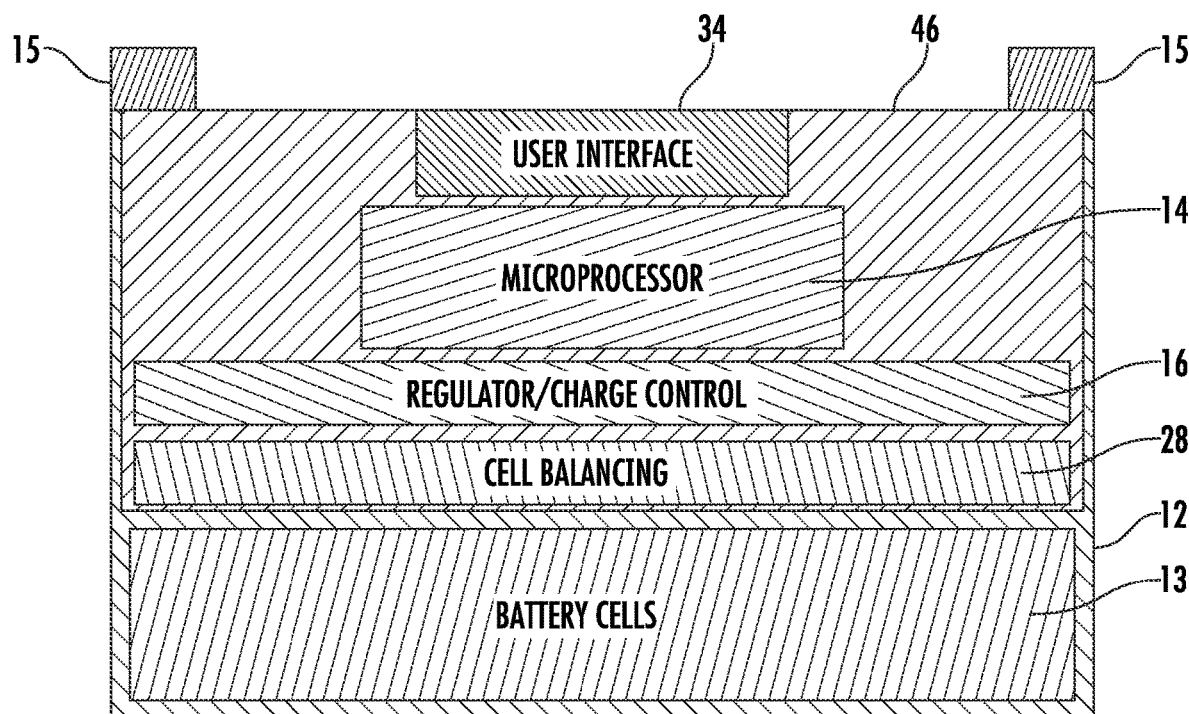
FIG. 10 is a schematic diagram of a battery with a battery management system contained therein.
Figure 11:
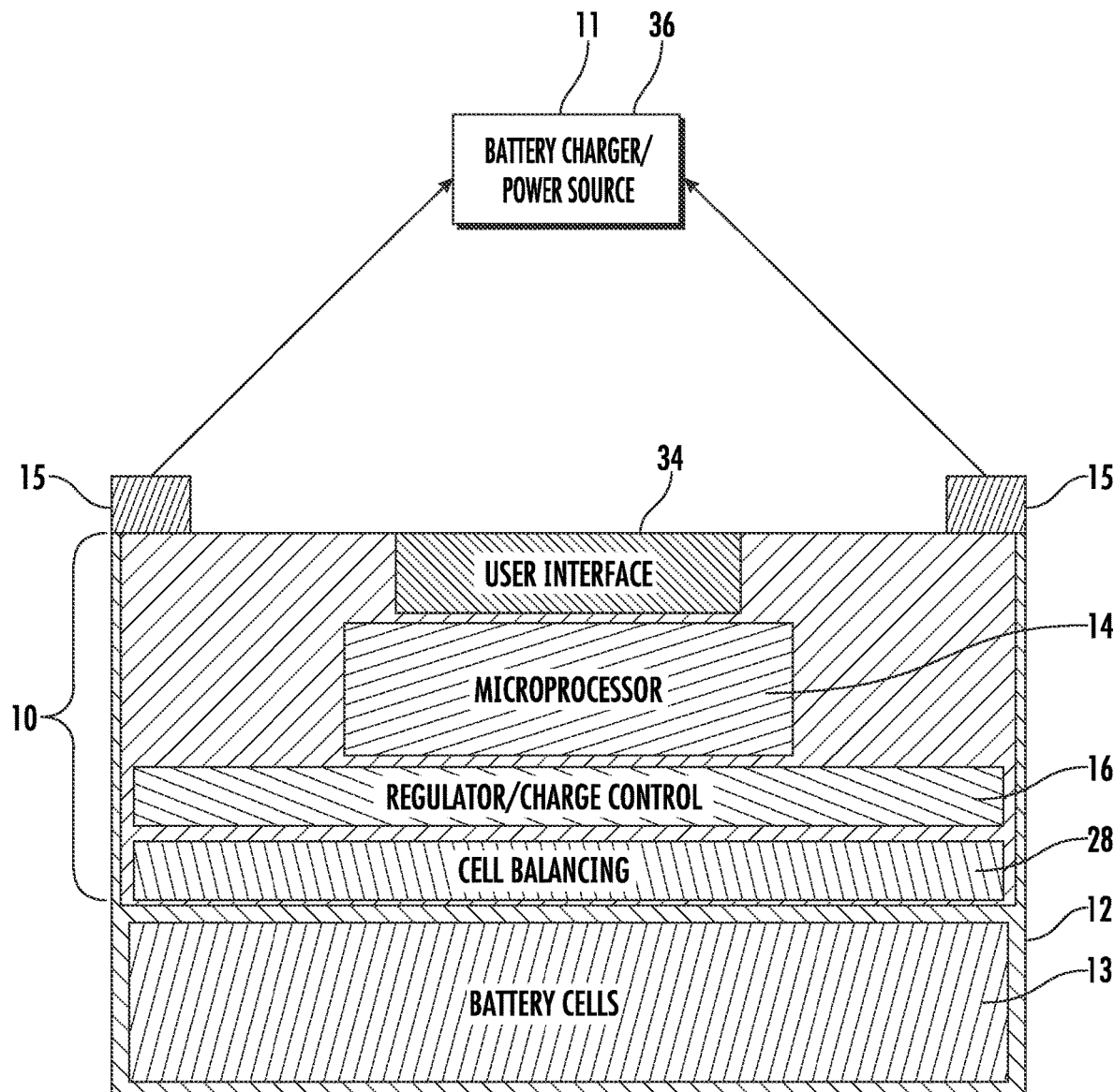
FIG. 11 is a schematic diagram of a battery with a battery management system contained therein and coupled to a battery charger or other power source.
Figure 12:
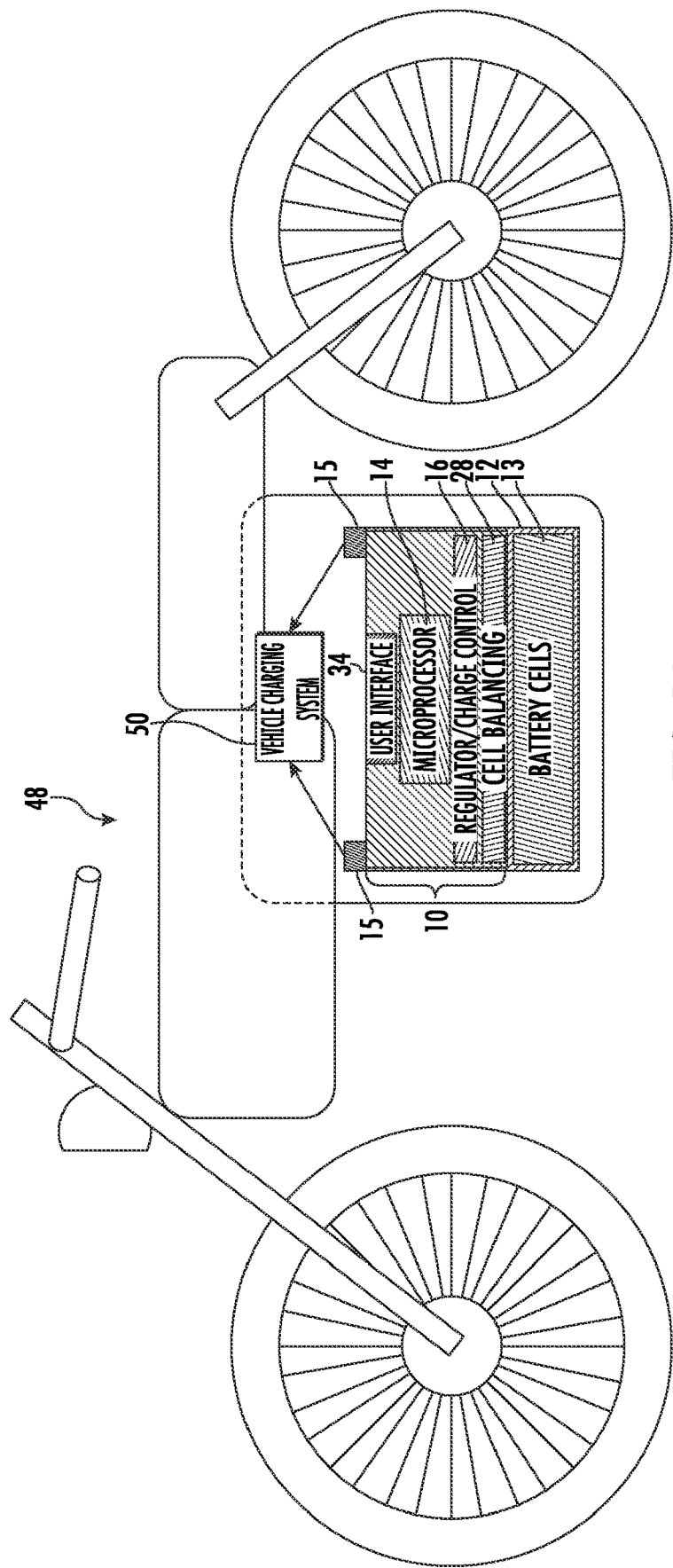
FIG. 12 is a schematic diagram of a battery with a battery management system contained therein, positioned within a vehicle and coupled to a vehicle charging system therein.
Figure 13:
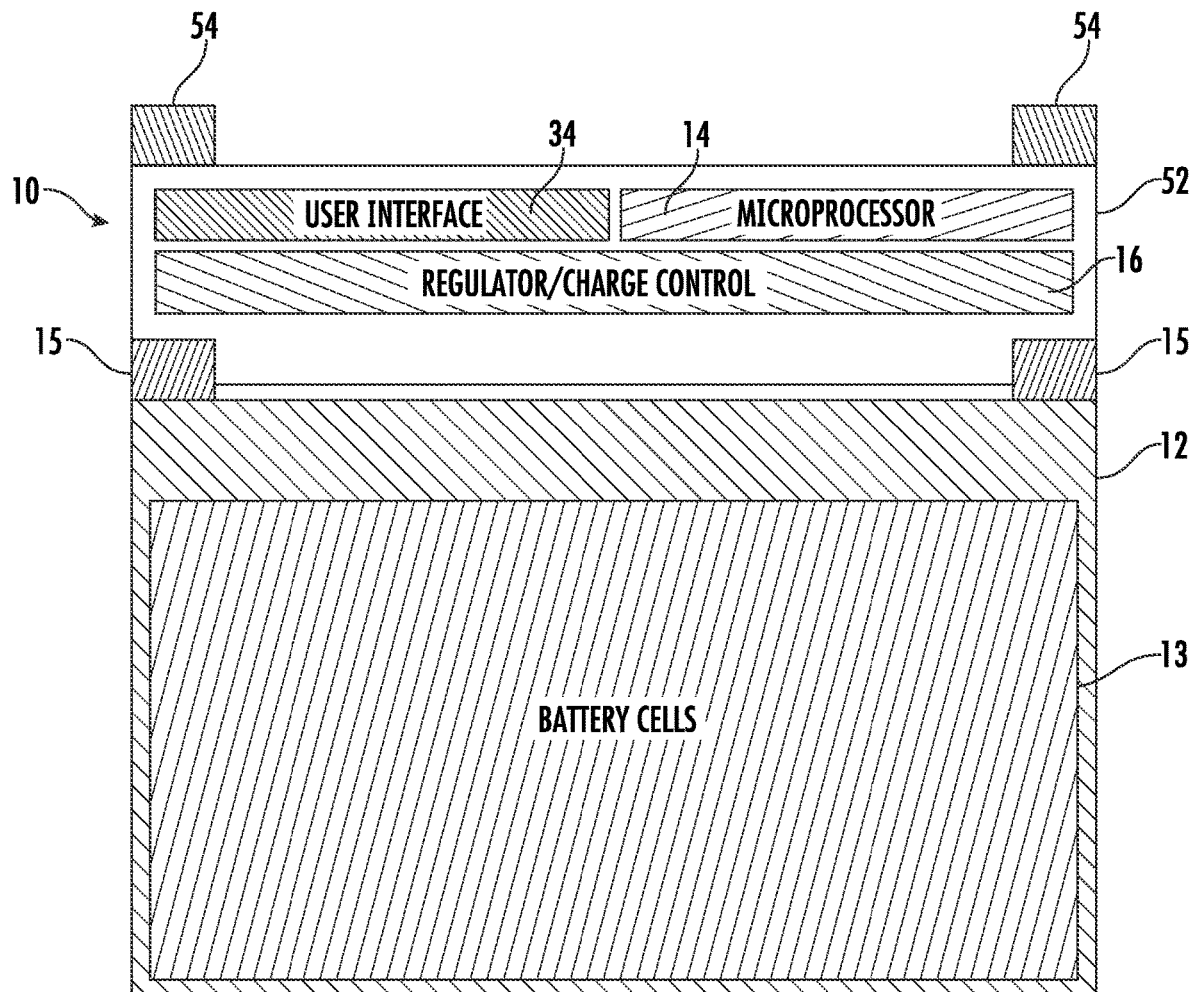
FIG. 13 is a schematic diagram of a battery management system self-contained within a battery management system housing and attached to positive and negative posts of a battery and also including connections so that the battery management system can be coupled to another system.
Figure 14:
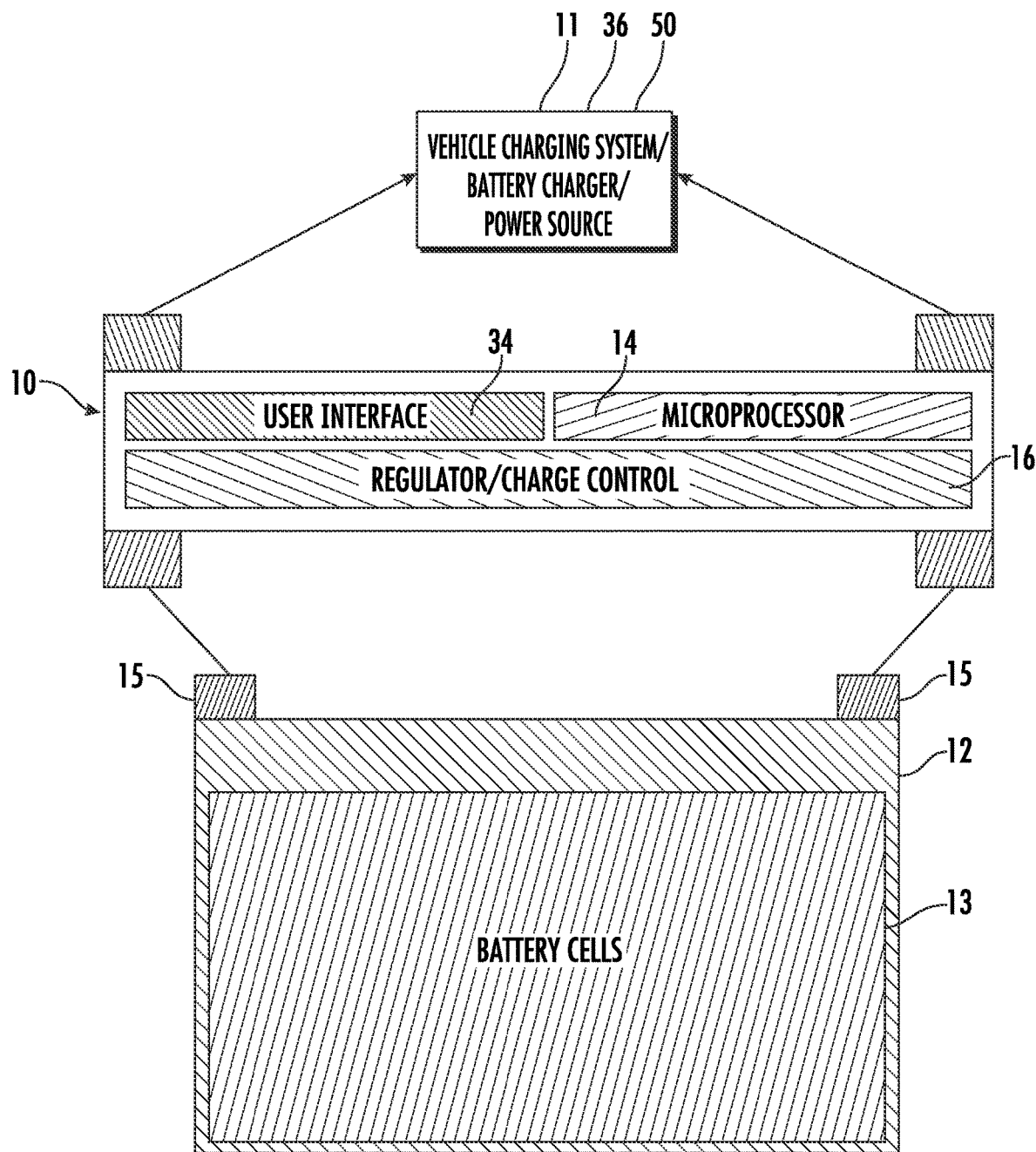
FIG. 14 is a schematic diagram of a battery management system self-contained within a battery management system housing and positioned remotely from the battery. The battery management system may be in electrical communication, in series, with the positive and negative posts of the battery and may be in electrical communication with a vehicle charging system, a battery charger or a power source.
Figure 15:
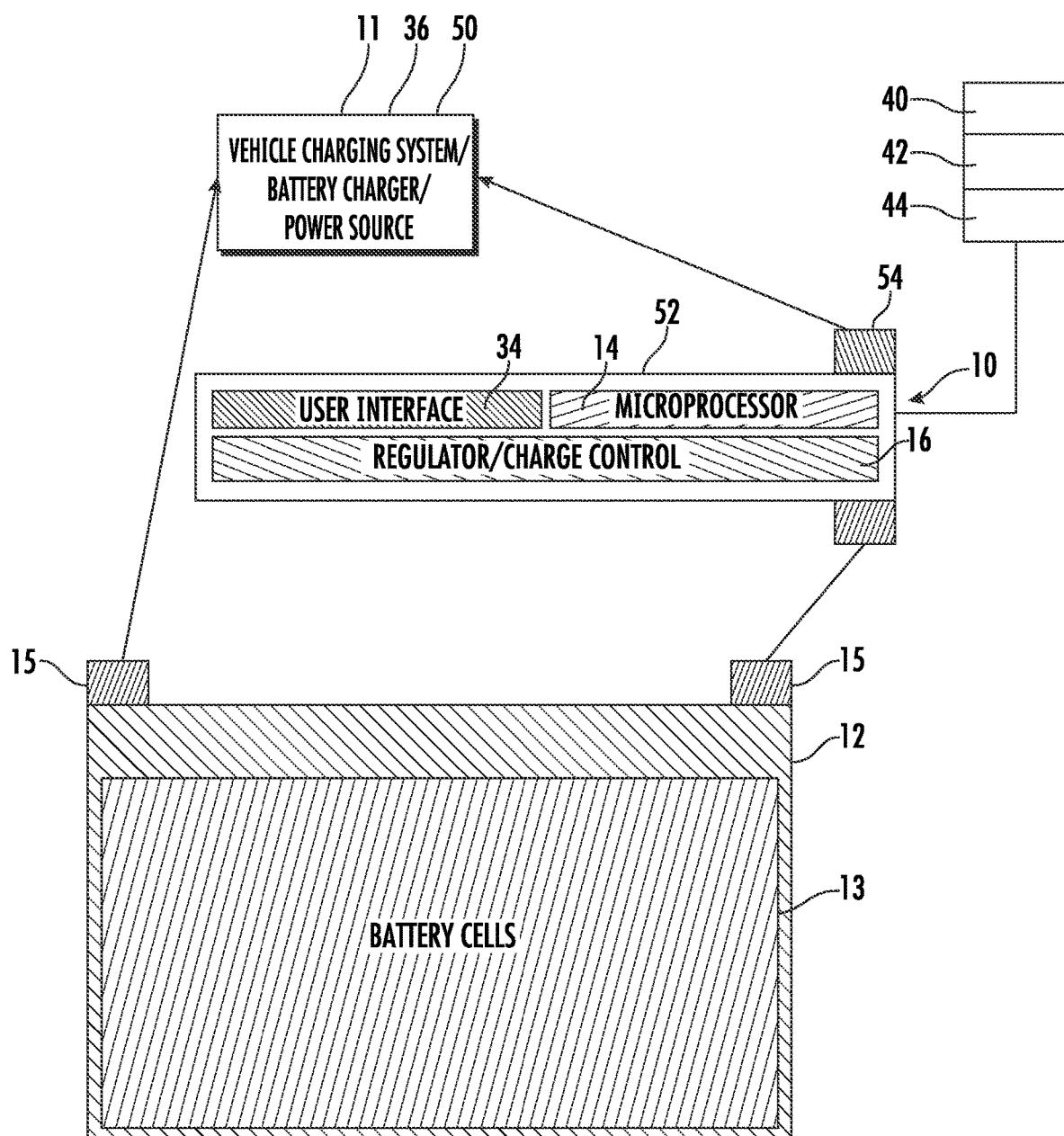
FIG. 15 is a schematic diagram of a battery management system self-contained within a battery management system housing and positioned remotely from the battery. The battery management system may be in electrical communication with only the negative posts of the battery and may be in electrical communication with a vehicle charging system, a battery charger or a power source.

The battery management system 10 may be configured in a number of different ways. In particular, the battery management system 10 may be positioned within a battery housing 46, as shown in FIG. 10. As such, the battery 12 and battery management system 10 may appear to be a single unit contained within the battery housing 46. In another embodiment, as shown in FIG. 11, the battery management system 10 may be positioned within a battery housing 46 and coupled to a battery charger 11 or a power source 36. In an embodiment shown in FIG. 12, the battery management system 10 may be positioned within a battery housing 46 and coupled to an electrical system and vehicle charging system 50 positioned within a vehicle 48. In another embodiment, as shown in FIG. 13, the battery management system 10 may be self-contained within a battery management system housing 52 that mounts to the posts 15 of a battery 12. The battery management system housing 52 may include posts 54 for connection to an electrical system of a vehicle 48 and the like. In another embodiment, as shown in FIG. 14, the battery management system 10 may be self-contained within a battery management system housing 52 that may be positioned remotely from a battery 12 and coupled to the battery posts 15 via electrical wires and the like and may be coupled to a vehicle charging system 50, battery charging system 11, power source 36 and the like. In such configuration, the battery management system 10 may be wired in series to both battery posts 15. In another embodiment, as shown in FIG. 15, the battery management system 10 may be self-contained within a battery management system housing 52 that may be positioned remotely from a battery 12 and coupled to a negative battery post 15 via an electrical wire or the like and may be coupled to a vehicle charging system 50, battery charging system 11, power source 36 and the like.

The battery management system 10 may be configured to monitor a number of parameters. In particular, the battery management system 10 may be configured to measure input voltage independent of cell pack voltage and independent of individual cell voltages. The battery management system 10 may be configured to measure input current to the battery 12. Similarly, the battery management system 10 may be configured to measure output current from the battery 12. The battery management system 10 may be configured to measure the state of charge of the battery cells 13 and the cell pack forming the battery 12. The battery management system 10 may be configured to measure resting voltage of the battery cells 13 while charging. In at least one embodiment, the battery management system 10 may accomplish this by removing the input charge momentarily and measuring the resting voltage during this momentary removal of the input charge. The battery management system 10 may compensate for temperature. If the battery 12 is above a temperature threshold, i.e. too hot, then the battery management system 10 will stop the discharge current. If the battery 12 is below a temperature threshold, i.e. too cold, then the battery management system 10 will stop the charge current.

In at least one embodiment, the battery management system 10 may be configured to control current or voltage, or both, to each cell to prevent overcharging and damage to the battery 12. The battery management system 10 may operate in one of a plurality of modes including, but not limited to, a normal mode, an under voltage protection mode and an over voltage protection mode, at any given time. The battery management system 10 may be configured such that the battery 12 has voltage present on the posts 15 of the battery 12. Such configuration enables chargers and charging systems to work properly to charge the battery 12.

The battery management system 10 may include an under voltage protection mode to protect one or more cells 13, or an entire battery 12 formed from a plurality of cells 13 from losing too much voltage. Unlike conventional technology, the battery management system 10 can enable a voltage to be present across the poles of a battery 12 when the battery 12 is in undervoltage protection mode to enable the battery voltage to be monitored. As such, the battery management system 10 may be configured to allow a battery's voltage to be read while in under voltage protection mode while limiting current flow. Additionally, the battery management system 10 may be configured to allow a minimum discharge current to operate critical systems, such as, but not limited to the security system described herein. The battery management system 10, a user or the like may adjust this minimal current flow available when one or more battery cells 13 are in under voltage protection mode, for example, during an emergency start in the engine start mode. As such, the battery management system 10 may function such that a voltage across the posts of a battery 12 may always be present, even in under voltage protection mode. Under voltage protection mode may also automatically clear once the battery charge is sufficient or may be cleared via direction from a user through a wireless or other communications interface. Under voltage protection mode may also automatically clear, such as being temporarily suspended, upon detection of an engine start attempt discussed below.

The battery management system 10 may be designed to require no calibration. The battery management system 10 may use one or more, or multiple, voltage references as a direct comparison for under voltage protection and over voltage protection. Under voltage protection mode occurs when the voltage of one or more of the cells 13 is less than a threshold. The battery management system 10 may then open the discharge path preventing further discharging of the cells 13. The threshold can be set at a point to prevent damage to the cells 13 or to allow sufficient charge in the cells 13 for critical operations such as an engine start. Over voltage protection mode occurs when the voltage of one or more of the cells 13 is greater than a threshold. The battery management system 10 may open the charging path preventing further charging of the cells 13. The threshold is set at a point to prevent damage to the cells.

The battery management system 10 may include a controller 14, which in at least one embodiment, may be, but it not limited to being, a microcontroller 14. The controller 14 may be configured to control voltage via under and over voltage protection modes and to charge each cell individually in a multicell battery 12. The battery management system 10 may include precision voltage references for use as a direct comparison for the under voltage protection mode and the over voltage protection mode. The controller 14 may be configured to sense whether an individual cell voltage is equal to or greater than an over voltage protection mode reference voltage. If the individual cell voltage is equal to or greater than the over voltage protection reference voltage, then the controller 14 may place the individual battery cell 13 or entire cell pack forming the battery 12 in over voltage protection mode. In at least one embodiment, the controller 14 may place the individual battery cell 13 or entire cell pack forming the battery 12 in over voltage protection mode via opening a charging field effect transistor 24. The controller 14 may be configured such that when the controller 14 senses that an individual cell voltage is equal to or less than an under voltage protection mode reference voltage, the controller 14 may place the individual battery cell 13 or entire cell pack forming the battery 12 in the under voltage protection mode. In at least one embodiment, the controller 14 may place the individual battery cell 13 or entire cell pack forming the battery 12 in the under voltage protection mode via opening a discharging field effect transistor 26. In at least one embodiment, the controller 14 is a microcontroller or other appropriate device.

A voltage regulator 16 may be used as the input for the cell charging circuit. The voltage regulator 16 may filter input voltage ripple before it reaches the cells. The voltage regulator 16 may be set to the charge voltage level. Setting the voltage regulator 16 to the charge voltage level will allow maximum loading on the external charging system. This loading models a lead acid or absorbent glass mat style battery 12. The battery management system 10 uses the voltage regulator 16 as a direct current voltage regulator to generate the power output power algorithm to charge and maintain the battery cells 13 individually. The algorithm may be broken into two main parts: constant current control mode and a constant voltage mode. The constant voltage mode may be set by feedback resistors in the voltage regulator circuit. Constant current may be set by measuring the resting voltage of the battery cells 13 and using variable feedback resistors to set a voltage higher than the resting cell voltage. The difference is that in the set voltage versus the resting cell voltage depends on the state of charge of the cells 13. A lower state of charge will require less difference between the set voltage and resting cell voltage. The constant current mode voltage set point will be increased until the voltage reaches the constant voltage limit of the charging algorithm. It is important to incrementally increase the set point voltage in smaller increments when the state of charge is low on the battery cells to prevent the battery management system 10 from going into an over current protection mode in the regulator 16. The DC regulator 16 has a current limit and increasing the set point voltage prematurely will cause the DC regulator 16 to go in an overload/shutdown mode or cause the regulator 16 to fail.

The voltage regulator 16 will have two operating modes: a constant current mode and a constant voltage mode. In order to properly control the state of the voltage regulator 16, there may be a feedback loop measuring the cell voltage and the voltage regulator 16 adjust. The cell voltage will be measured with the discharge field effect transistor open and the battery impedance emulator circuit engaged so the external charging system will maintain the quieting load on the system; thereby, maintaining the model of a lead acid or absorbent glass mat battery 12. The voltage regulator 16 may be in constant current mode when the cell voltage is less than the current voltage level. The microcontroller 14 may use an adjustable voltage regulator 16 to maintain the maximum output of the voltage regulator 16 while in constant current mode. Once the cell voltage reaches the charge level voltage, the microcontroller 14 will fix the regulated voltage adjust entering constant voltage mode and will remain in this mode until the cell voltage level drops below the charge voltage level. Hysteresis may be added to ensure there is not an oscillation of the states in the feedback loop. The voltage regulator 16 measures a cell voltage for a single battery cell 13 independently of other battery cells 13 within the same battery 12.

Typical charging systems in vehicles have a wide variance of input charge power. There often exists large fluctuations in current and voltage in these systems. Voltages can range from 12 Volts direct current to greater than 20 Volts direct current. The voltage regulator 16 may accept this wide range of input current and voltages and output a consistent state for the battery cells to charge. As such, the voltage regulator 16 may regulate the input voltage and input current. This may allow for longer cell life, longer battery life, longer battery pack life, and more consistent performance.

The battery management system 10 may include a cell balancing system 28. The cell balancing system 10 may be incorporated to maximize the life of the battery cells. This may consist of a discharge resistor and a voltage monitor 18 on each cell. The voltage monitor 18 may compare all four cells performance and activate the discharge resistor if a cell is significantly higher in voltage than its counterparts. The battery cells 13 may be discharged independently from each other within a single battery 12 or multiple batteries 12.

Figure 3:
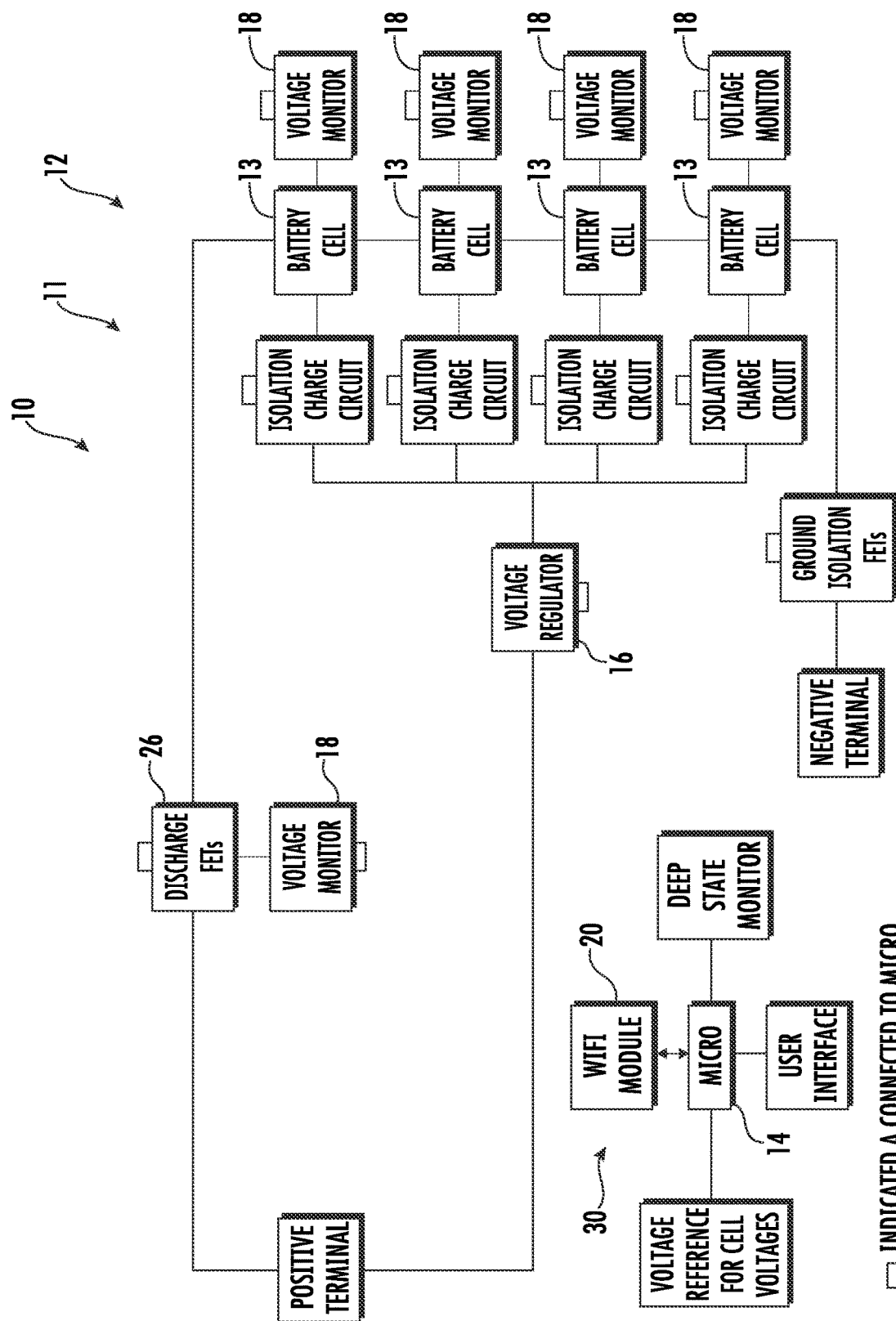
FIG. 3 is a schematic diagram of another embodiment of the battery management system.
Figure 4:
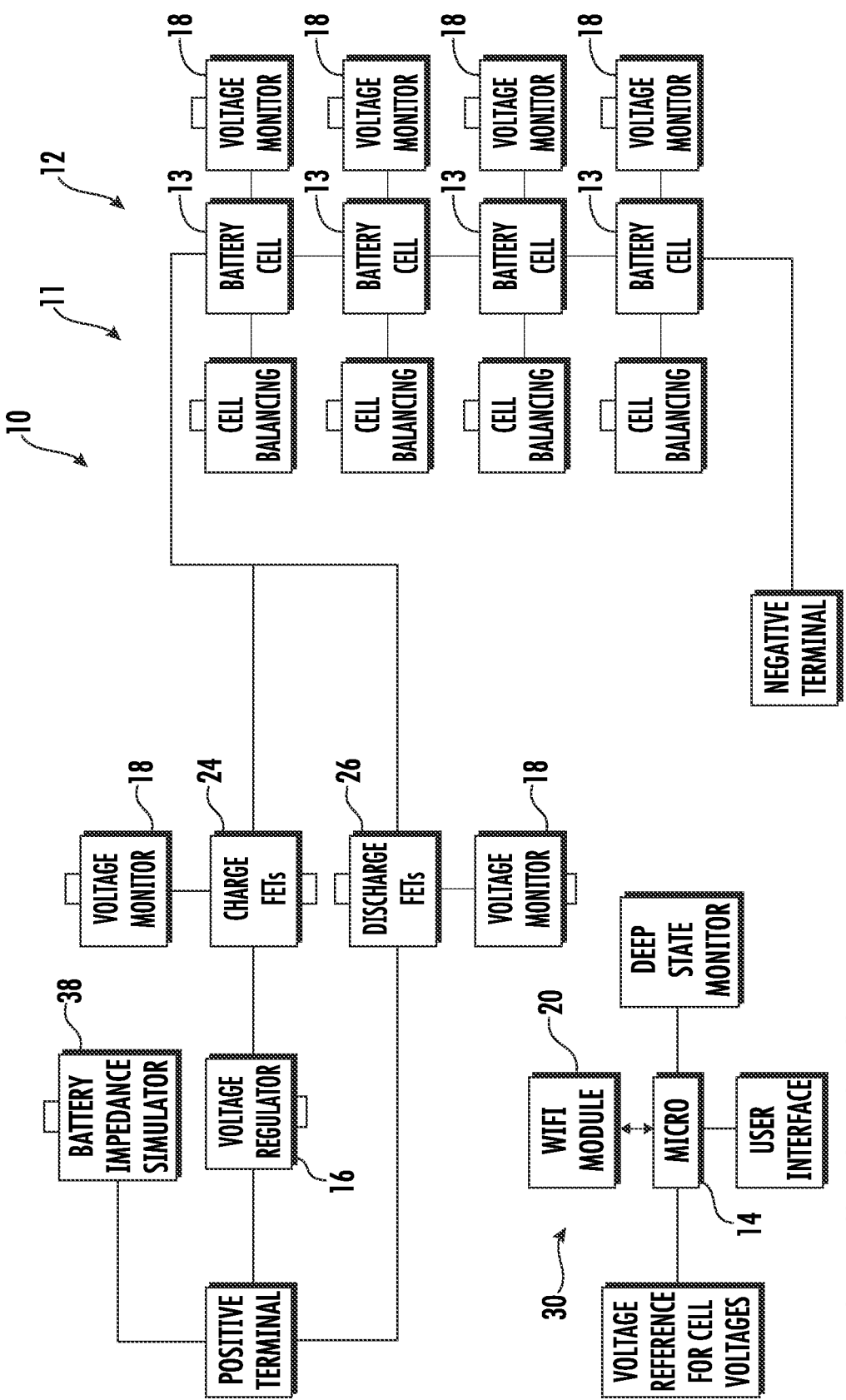
FIG. 4 is a schematic diagram of another embodiment of the battery management system.
Figure 5:
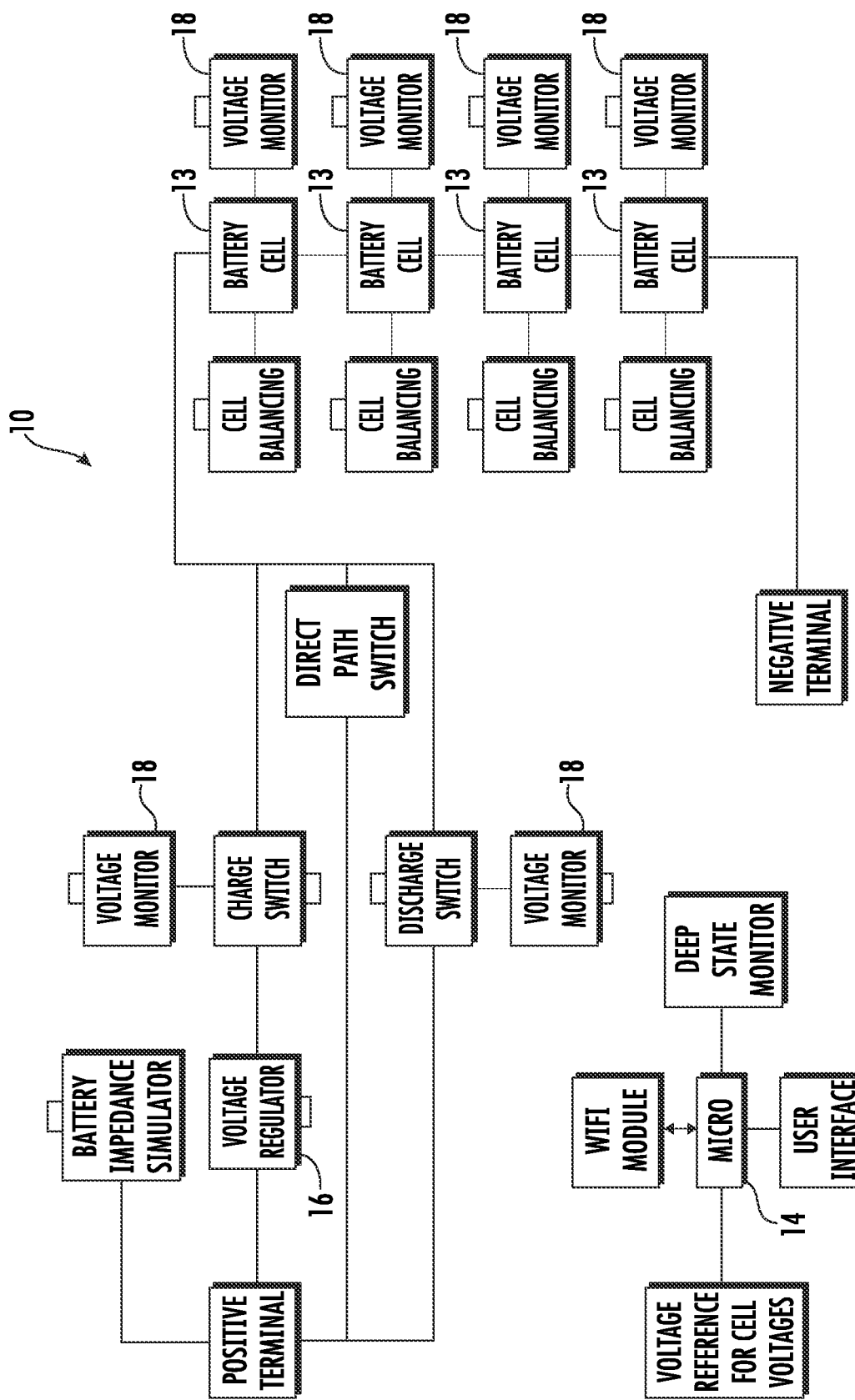
FIG. 5 is a schematic diagram of another embodiment of the battery management system.
Figure 6:
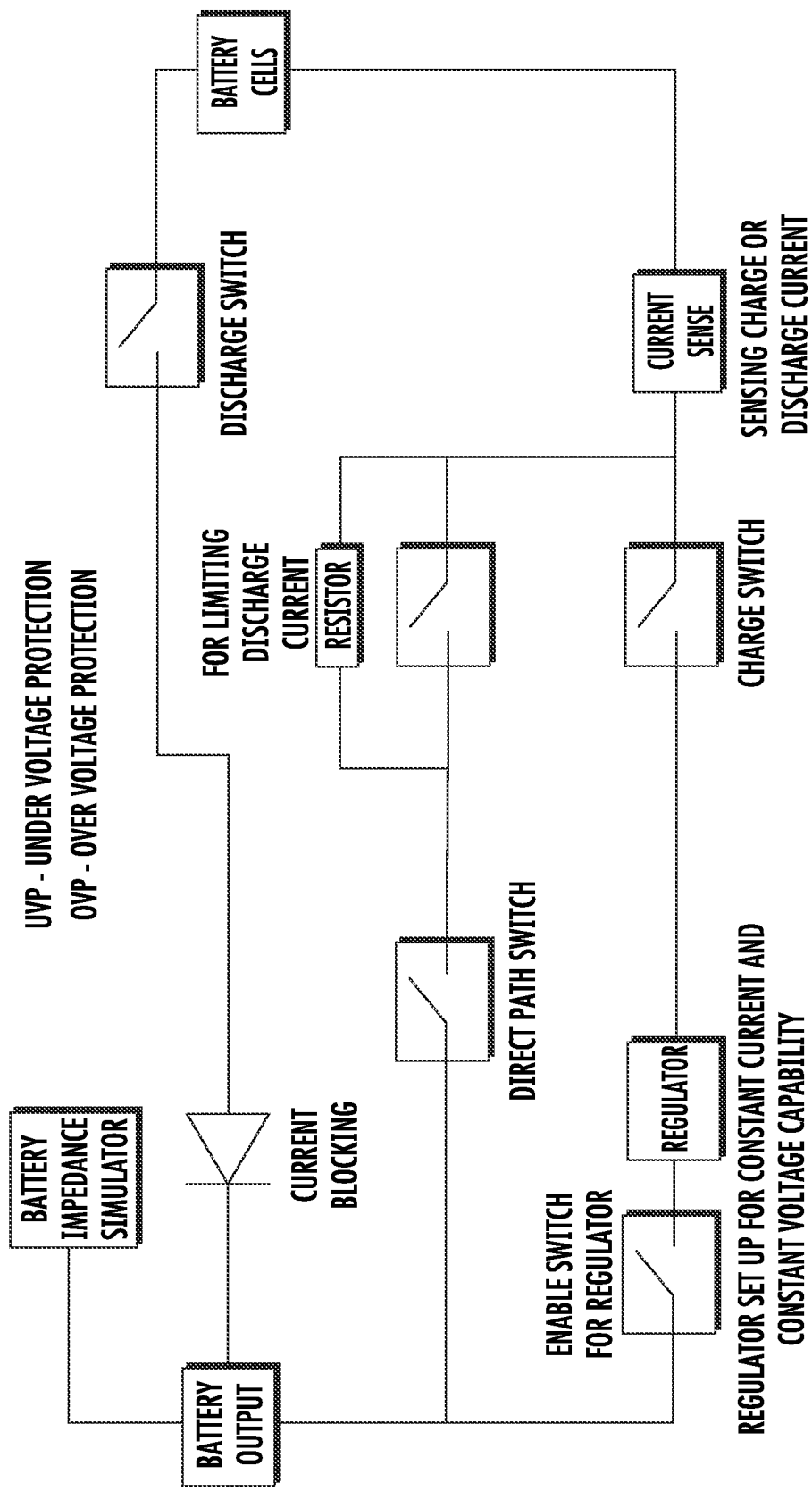
FIG. 6 is a schematic diagram of another embodiment of the battery management system.

The battery management system 10 may include a wired or wireless communication system 30, as shown in FIGS. 3-5. In at least one embodiment, the communication system 30 may be, but is not limited to being, a wireless module 20. In at least one embodiment, the communication system 30 may be configured to communicate with an application to a user or others to monitor individual cell status, cell pack status and other data, such as, but not limited to, state of charge of one or more of the cells individually, state of charge of all of the cells forming a battery, voltage of the cells, voltage of all of the cells forming a battery, temperature of the all of the cells forming a battery, discharge current, charge current, number of charging cycles on each cell, input voltage, temperature, whether the battery is in under voltage protection mode, whether the battery is in over voltage protection mode, discharging current and charging current, number of charging cycles, status of cell balancing, determination of how close a voltage of each cell is to an average voltage of all the cells. The communication system 30 may be configured for inter-battery management system 10 communications to facilitate parallel and series battery configurations. The communication system 30 may be configured to transmit alerts to an application such as, but not limited to, under voltage protection mode, over voltage protection mode. The communication system 30 may be configured to receive commands from an application such as, but not limited to, enabling security features, disengaging under voltage protection. The communication system 30 may be configured to enable discharging given proximity to an authorized mobile device.

The battery management system 10 may include an alert system 31 configured to indicate to a user various information. In at least one embodiment, the alert system 31 may include one or more visual alerts, such as, but not limited to, three light emitting diodes to indicate the battery 12 is powered, the communication system 30 is operational, and an error light emitting diode indicating any abnormalities. The alerts system 31 may communicate alerts to a user via visual indicators physically attached to the system or via communications, such as through the wireless communication system 30 to a user device 102, 111 and the like.

Figure 8:
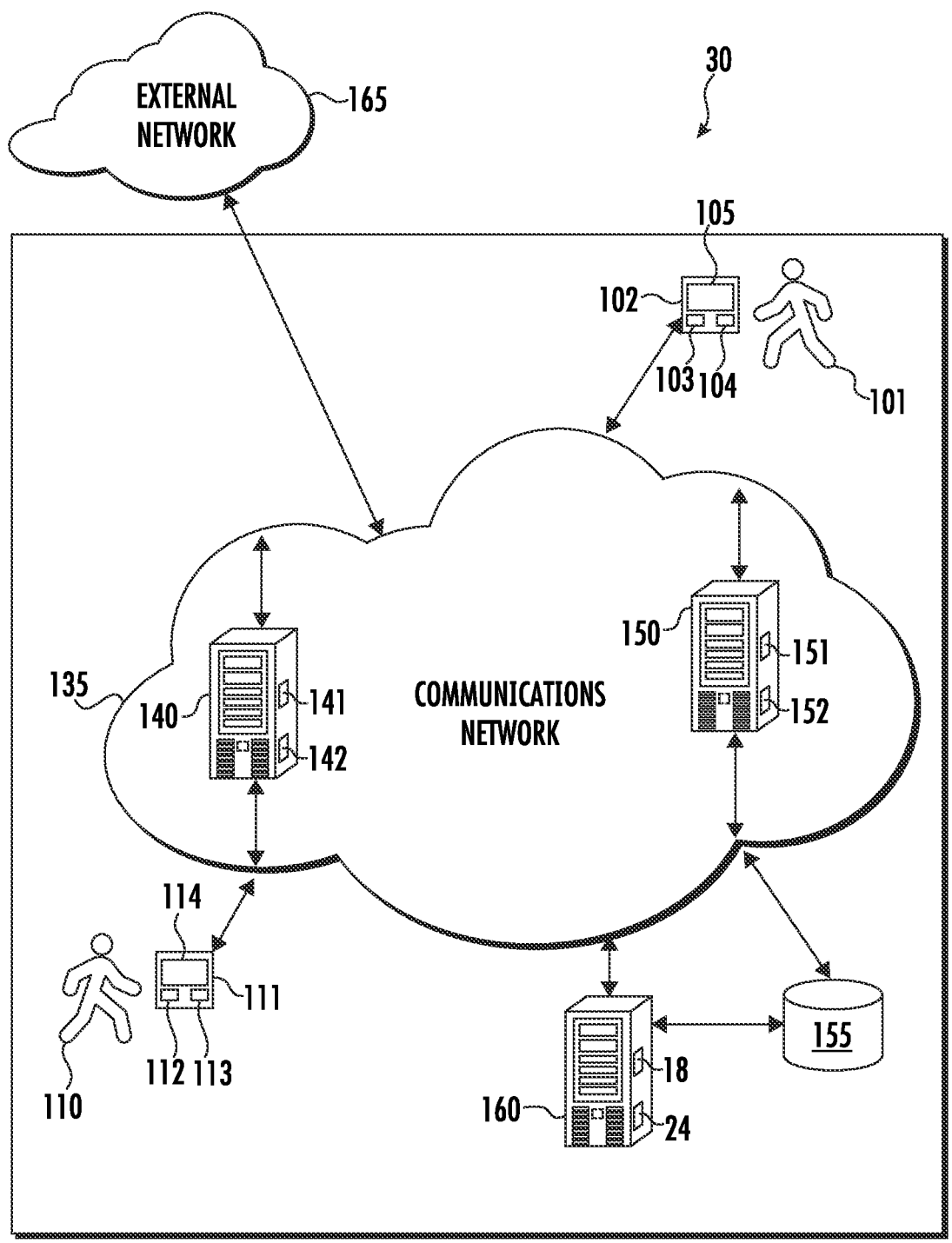
FIG. 8 is a schematic diagram of the system enabling users to access data collected via the system from remote locations.

The battery management system 10 may also include an input system 34 configured to enable a user to input information into the system 10. In at least one embodiment, the input system 34 may be formed from one or more input devices, such as, but not limited to buttons, one to reset the communication system 30 and one to reset the microcontroller 14. In at least one embodiment, the battery management system 10 may be configured such that the input system 34 is a device, such as, but not limited to a user device 102, 111, as shown in FIG. 8, which may be a computer, a laptop, a tablet device, a phablet, a server, a mobile device, a smartphone, a smart watch, and/or any other type of computing device. A user may communicate with the battery management system 10 via any appropriate portal on the user device 102, 111, such as, but not limited to, a battery management system application (app), other software programs and the like. The battery management system 10 may communicate to a user in through a user account, which the user may choose to view on any device, with alerts and other notifications set forth herein. The user may communicate with the battery management system 10 via the user account via any device. The user account may be established on a system for use by the battery management system 10.

The battery management system 10 may include an engine start mode enabling an engine to which a battery of the battery management system 10 is attached, to be started. In at least one aspect of the engine start mode, the battery management system 10 may be configured to enable an emergency start function. If the battery 12 is discharged to the under voltage protection threshold and a user would like to reset the battery 12 to try and perform an engine start, the controller 14 will disengage the under voltage protection mode upon boot-up. This will allow the user to perform a boot with input to the controller 14 such as via a controller reset button, which may be, but is not limited to being, positioned inline on a charging cable, then immediately try an engine start before time expires on the engine start mode and under voltage protection mode is activated. During use, when the battery 12 is discharged to an under voltage protection level, the battery management system 10 engages the under voltage protection mode. In the under voltage protection mode, the batter management system 10 prevents the battery from discharging any voltage to protect the battery 12 from being completely discharged, thereby preventing further battery discharge and thus also prevents actions such as engine start. The controller 14 of the battery management system 10 may enable an emergency start function by temporarily disengaging the under voltage protection mode to create an engine start window in which the battery is permitted to discharge, thereby enabling an engine start to be attempted during the engine start window. The engine start window may be, but is not limited to being between two seconds of time and five minutes of time. In another embodiment, the engine start window may be, but is not limited to being between ten seconds of time and one minute of time. The controller 14 may automatically disengage the under voltage protection mode once the battery charge is sufficient.

A user may indicate the user's desire to try an emergency start on a vehicle, such as, but not limited to a motorcycle, to which the battery management system 10 is attached. As such, the user may disengage the under voltage protection mode via user input, such as, but not limited to, the user turning an ignition key on and off a predetermined number of times, pushing an engine start button on and off a predetermined number of times, via a user interface, such as, but not limited to, a wireless device, such as an application on a cellular phone communicating via a wireless interface, such as a radio frequency interface, or other such input. The under voltage protection mode may be disengaged through a wired, a wireless or other type communications interface. In another embodiment, the controller 14 may automatically disengage the under voltage protection mode upon detection of an engine start attempt via use of the ignition key or ignition system.

The battery management system 10 may include a system control module configured to maintain the integrity of an electrical system, such as a vehicle electrical system, to which the battery management system 10 is attached when the battery management system 10 is in an over voltage protection mode. In particular, the system control module simulates a battery 12 so that the electrical system, such as a vehicle electrical system, to which the battery management system 10 is attached does not develop odd, explained errors and operating conditions when the battery management system 10 is in an over voltage protection mode. The system control module may emulate the battery's impedance when measuring the voltage of each cell. The system control module of the battery management system 10 may include a battery impedance emulator 38 to stabilize the battery management system 10 when in over voltage protection mode. During use, when one or more of the battery cells 13 in a call pack forming a battery 12 reach or exceed an over voltage protection level, the battery management system 10 may engage the over voltage protection mode. Once engaged, the over voltage protection mode disconnects the battery cells 13 from the loading battery management system 10. This can cause the battery management system 10 to become unstable resulting in electrical system failures, however, the battery impedance block 32 emulates the load of a standard battery thereby maintaining the battery management system 10 stability and preventing system instability.

Figure 1:
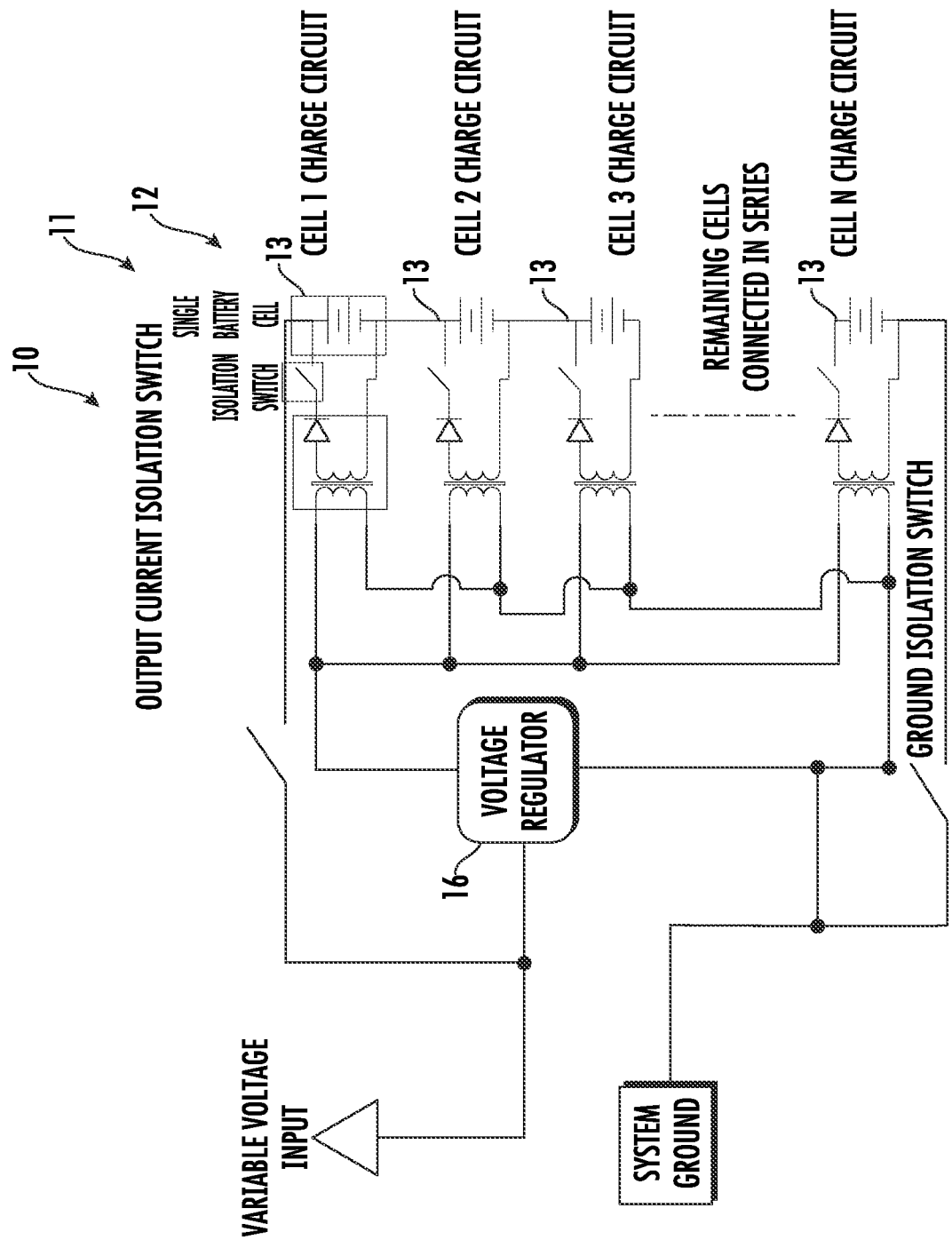
FIG. 1 is a schematic diagram of the battery management system.
Figure 2:
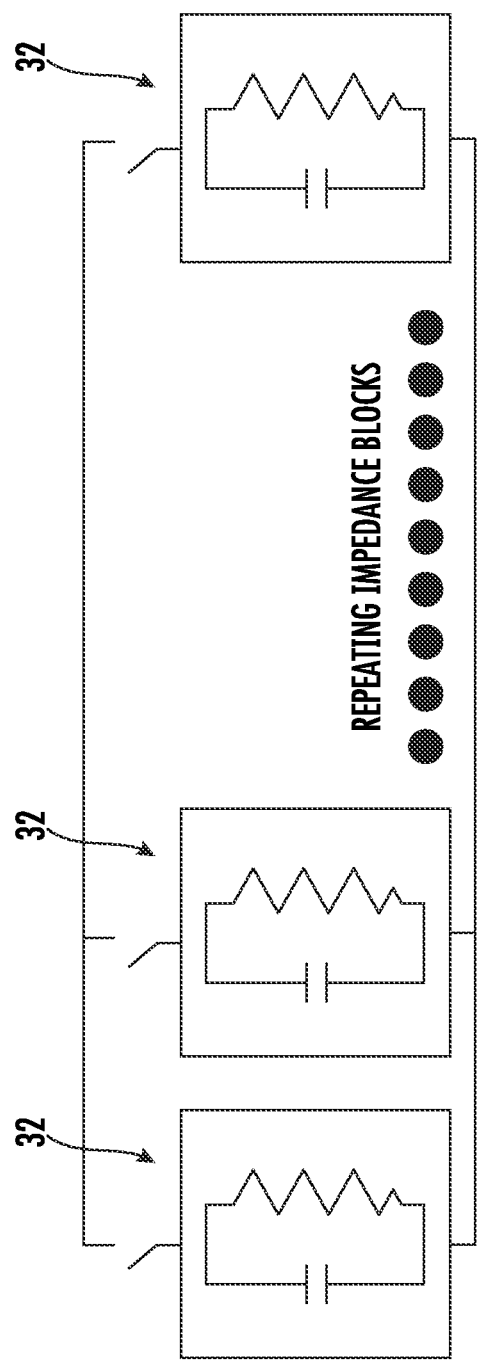
FIG. 2 is a schematic diagram of a portion of the battery management system.

The battery management system 10 operates such that each impedance block 32 emulates the battery 12, as shown in FIG. 2. When an impedance block 32 reaches capacity, the impedance block 32 is switched out and a discharged impedance block 32 switched in. The capacity of the impedance block 32 is determined by measurements of the voltage on the input. Each impedance block 32 may be self-discharging. The number of impedance blocks 32 necessary depends on the discharge time of each impedance block 32 versus the characteristics of the charging system to which the battery 12 is coupled.

The battery management system 10 may include a security system configured to secure the battery 12 to prevent theft of a vehicle by securing the battery 12. In at least one embodiment, the battery management system 10 may be configured to prevent outflow of current and thereby prevent an engine start after the security system has been activated. The security system may be activated automatically by the controller 14 after a predetermined threshold has been met. The security system may be activated by a user. The user may communicate with the controller 14 via the communication system 30.

The battery management system 10 may include a smart charger detection module configured to detect the presence of a smart charger attached to posts of a battery 12. A smart charger is configured to only apply a charge when it detects a voltage across the posts, also referred to as the battery terminals, of the battery 12. If a smart charger doesn't sense voltage across the posts, then the smart charger will not apply a charge. During use, the battery management system 10 may sense that it is receiving an input charge. The battery management system 10 may remove all battery cells 13 from supplying voltage to the battery posts. The battery management system 10 then determines whether a charge remains at the battery posts. If a charge remains, the battery management system 10 concludes that conventional charger is attached to the battery 12. If the battery management system 10 determines that no charge exists across the posts of the battery 12, the battery management system 10 concludes that a smart charger is attached to the battery 12.

The battery management system 10 may be configured such that at least two different charging paths exist. In particular, the battery management system 10 may have a charging path for a conventional charger in which a regulator exists. The battery management system 10 may also include a charging path whereby a smart charger is attached directly to posts of a battery 12. As such, the charging path for a smart charger is a direct path to the cell pack, battery 12, thereby allowing the smart charger to manage charging.

The battery management system 10 may be configured for engine starts applications. In particular, the battery management system 10 may be configured to replace cell banks 12 with super capacitors or may be configured to be compatible with a combination of cell banks and super capacitors allowing for high instantaneous current draw events, such as, but not limited to engine starts. The battery management system 10 may be configured to collect cells into pack banks, which may allow one or more packs 12 to be discharged while the other packs 12 are being charged and thus always maintaining a load on the charging system. The battery management system 10 may be configured to integrate learning/filtering into the software to customize the reserve charge set aside for engine starts. The battery management system 10 may include a battery charging system 11 including one or more power source connections. The battery charging system 11 may include one or more voltage regulators per battery cell.

The battery management system 10 may include a voice control module. The voice control module may enable input to be made by the battery management system 10 to be controlled via voice commands. The battery management system 10 may be configured to be an intelligent system to learn the language and dialect of the user. The battery management system 10 may be configured to be adjusted to operate in any language configurable by a user. An example of a voice command would be a user stating verbally "Security Enable", which would enable the security system described herein and limit the current flow out of the battery 12 to prevent an engine start but allow the electronics to be powered. The battery management system 10 may be configured such that the voice control module can be incorporated in an embodiment in which the battery management system 10 is embedded in the battery 12. The battery management system 10 could be included within a combo charger/jump-pack. A speaker 40, microphone 42 and amplifier 44, as shown in FIG. 15, may be included to enable the voice control module. In at least one embodiment, the battery management system 10 includes a command set of words that a user could use verbally to control various aspects of the battery management system 10. In at least one embodiment, the battery management system 10 may be in communication with a remote server system, such as, but not limited to an Amazon Web Services and the like, via the wireless communication system 30 to enable the voice control module to operate on a greater range of commands. For instance, more CPU power would be available on Amazon Web Services servers which would allow for wider range of voice input.

Figure 9:
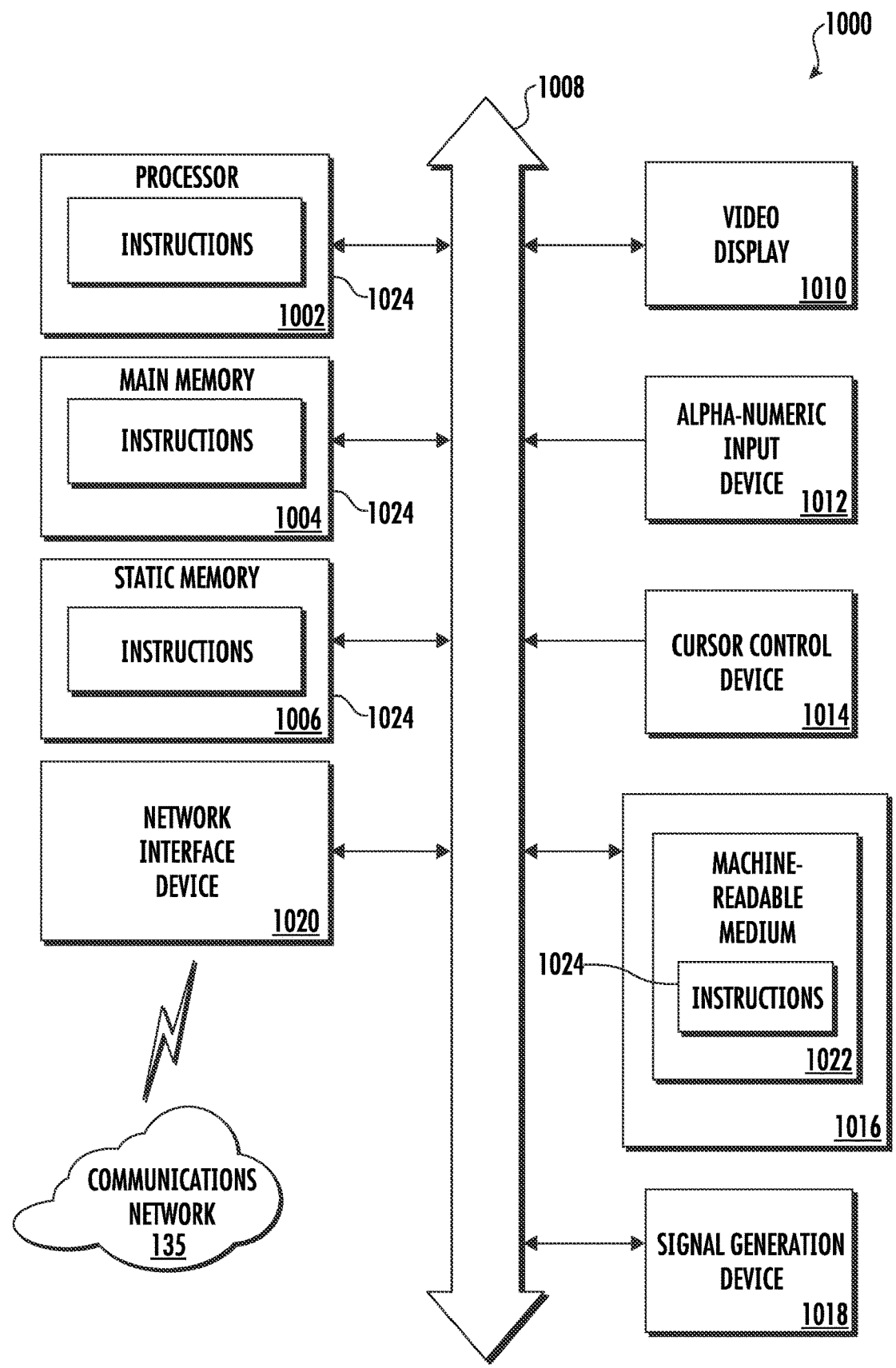
FIG. 9 is a schematic diagram of a machine in the form of a computer system within which a set of instructions, when executed, may cause the machine to perform any one or more of the methodologies or operations of the system.

As shown in FIGS. 8 and 9, the battery management system 10 may include a wireless communication system 30 enabling analysis and review of the data of the battery management system 10 to take place anywhere desired. The system 10 may be configured to be accessible via systems such as, but not limited to, machine learning services, data and content services, computing applications and services, cloud computing services, internet services, satellite services, telephone services, software as a service (SaaS) applications and services, mobile applications and services, platform as a service (PaaS) applications and services, web services, client servers, and any other computing applications and services. The system 10 may include a first user 101, who may utilize a first user device 102 to access data, content, and applications, or to perform a variety of other tasks and functions. As an example, the first user 101 may utilize first user device 102 to access an application (e.g. a browser or a mobile application) executing on the first user device 102 that may be utilized to access web pages, data, and content associated with the system 10. The system 10 may include any number of users.

The battery management system 10 may be configured to use the wireless communication system 30 to enable a user to communicate with the battery management system 10. The battery management system 10 may include one or more wireless modules 20, which may be fashioned as a hubs to communicate wirelessly to the wireless communication system 30. The hub 20 could be in a charger with a WiFi connection and, through the wireless communication system 30, connect to tire pressure monitors, battery monitors, OBD data ports, and the like. The hub 20 could connect through a user's WiFi network to a servers of a battery management system provider. The hub 20 could also be connected to servers of a battery management system provider via the wireless communication system 30 described herein. A user may monitor the status of connected sensors through any connection to the battery management system 10, such as, but not limited to, a mobile app, a web-based portal and other devices described herein. A user may also control the battery management system 10 and such features as stopping a battery charger, enabling a security feature and the like. The command of the battery management system 10 may be either for an individual consumer or for fleet management. The battery management system 10 may be monitored via the wireless communication system 30 to via home speakers such as Amazon's Alexa. The battery management system 10 may include an alert system to generate and send alerts to a user such as, but not limited to, "Low Battery Warning", "Low Tire Pressure Warning", "Vehicle Is Moving", "Temperature Warning", and the like. A user may also issue verbal commands such as "Charge My Battery" and the like that could be received via a microphone in close proximity to the user and transmitted via the wireless communication system 30 to the battery management system 10.

In at least one embodiment, the wireless communication system 30, as shown in FIGS. 8 and 9 may include a first user device 102 utilized by the first user 101 may include a memory 103 that includes instructions, and a processor 104 that executes the instructions from the memory 103 to perform the various operations that are performed by the first user device 102. In certain embodiments, the processor 104 may be hardware, software, or a combination thereof. The first user device 102 may also include an interface 105 (e.g. screen, monitor, graphical user interface, etc.) that may enable the first user 101 to interact with various applications executing on the first user device 102, to interact with various applications executing within the system 10, and to interact with the system 10 itself. In certain embodiments, the first user device 102 may include components that provide non-visual outputs. For example, the first user device 102 may include speakers, haptic components, tactile components, or other components, which may be utilized to generate non-visual outputs that may be perceived and/or experienced by the first user 101. In certain embodiments, the first user device 102 may be configured to not include interface 105. In certain embodiments, the first user device 102 may be a computer, a laptop, a tablet device, a phablet, a server, a mobile device, a smartphone, a smart watch, and/or any other type of computing device. Illustratively, the first user device 102 is shown as a mobile device in FIG. 8.

In addition to the first user 101, the system 10 may include a second user 110, who may utilize a second user device 111 to access data, content, and applications, or to perform a variety of other tasks and functions. As with the first user 101, in certain embodiments, the second user 110 may be any type of user that may review data from the system 10. Much like the first user 101, the second user 110 may utilize second user device 111 to access an application (e.g. a browser or a mobile application) executing on the second user device 111 that may be utilized to access web pages, data, and content associated with the system 10. The second user device 111 may include a memory 112 that includes instructions, and a processor 113 that executes the instructions from the memory 112 to perform the various operations that are performed by the second user device 111. In certain embodiments, the processor 113 may be hardware, software, or a combination thereof. The second user device 111 may also include an interface 114 (e.g. a screen, a monitor, a graphical user interface, etc.) that may enable the second user 110 to interact with various applications executing on the second user device 111, to interact with various applications executing in the system 10, and to interact with the system 10. In certain embodiments, the second user device 111 may be a computer, a laptop, a tablet device, a phablet, a server, a mobile device, a smartphone, a smart watch, and/or any other type of computing device. Illustratively, the second user device 111 may be a computing device in FIG. 1. The second user device 111 may also include any of the componentry described for first user device 102.

In certain embodiments, the first user device 102 and the second user device 111 may have any number of software applications and/or application services stored and/or accessible thereon. In certain embodiments, the software applications and services may include one or more graphical user interfaces so as to enable the first and second users 101, 110 to readily interact with the software applications. The software applications and services may also be utilized by the first and second users 101, 110 to interact with any device in the system 10, any network in the system 10, or any combination thereof.

The system 10 may also include a communications network 135. The communications network 135 of the system 10 may be configured to link each of the devices in the system 10 to one another. For example, the communications network 135 may be utilized by the first user device 102 to connect with other devices within or outside communications network 135. Additionally, the communications network 135 may be configured to transmit, generate, and receive any information and data traversing the system 10. In certain embodiments, the communications network 135 may include any number of servers, databases, or other componentry, and may be controlled by a service provider. The communications network 135 may also include and be connected to a cloud-computing network, a phone network, a wireless network, an Ethernet network, a satellite network, a broadband network, a cellular network, a private network, a cable network, the Internet, an internet protocol network, a content distribution network, a virtual private network, any network, or any combination thereof. Illustratively, server 140 and server 150 are shown as being included within communications network 135.

Notably, the functionality of the system 10 may be supported and executed by using any combination of the servers 140, 150, and 160. The servers 140, and 150 may reside in communications network 135, however, in certain embodiments, the servers 140, 150 may reside outside communications network 135. The servers 140 and 150 may be utilized to perform the various operations and functions provided by the system 10, such as those requested by applications executing on the first and second user devices 102, 111. In certain embodiments, the server 140 may include a memory 141 that includes instructions, and a processor 142 that executes the instructions from the memory 141 to perform various operations that are performed by the server 140. The processor 142 may be hardware, software, or a combination thereof. Similarly, the server 150 may include a memory 151 that includes instructions, and a processor 152 that executes the instructions from the memory 151 to perform the various operations that are performed by the server 150. In certain embodiments, the servers 140, 150, and 160 may be network servers, routers, gateways, switches, media distribution hubs, signal transfer points, service control points, service switching points, firewalls, routers, edge devices, nodes, computers, mobile devices, or any other suitable computing device, or any combination thereof. In certain embodiments, the servers 140, 150 may be communicatively linked to the communications network 135, any network, any device in the system 10, or any combination thereof.

The database 155 of the system 10 may be utilized to store and relay information that traverses the system 10, cache information and/or content that traverses the system 10, store data about each of the devices in the system 10, and perform any other typical functions of a database. In certain embodiments, the database 155 may store the output from any operation performed by the system 10, operations performed and output generated by the first and second user devices 102, 111, the servers 140, 150, 160, or any combination thereof. In certain embodiments, the database 155 may store a record of any and all information obtained from any data sources utilized by the system 10 to facilitate the operative functions of the system 10 and its components, store any information and data obtained from the internal and external data sources 201, 202, store the agglomerated models 208, store outputs generated by an application under evaluation 230, store feedback received from the first and second users 101, 110 and/or the first and second user devices 102, 111, store inputs entered into or utilized to interact with the application under evaluation 230, store software code 245 generated by the system 10, store reports 242 generated by the system 10, store analyses 243 generated by the system 10, store test results 246 generated by the system 10, store test data 247, store media training videos and media content, store any information generated and/or received by the system 10, any other data traversing the system 10, or any combination thereof. In certain embodiments, the database 155 may be connected to or reside within the communications network 135, any other network, or a combination thereof. In certain embodiments, the database 155 may serve as a central repository for any information associated with any of the devices and information associated with the system 10. Furthermore, the database 155 may include a processor and memory or be connected to a processor and memory to perform the various operations associated with the database 155. In certain embodiments, the database 155 may be connected to the servers 140, 150, 160, the first user device 102, the second user device 111, any devices in the system 10, any other device, any network, or any combination thereof.

The database 155 may also store information obtained from the system 10, store information associated with the first and second users 101, 110, store location information for the first and second user devices 102, 111 and/or first and second users 101, 110, store user profiles associated with the first and second users 101, 110, store device profiles associated with any device in the system 10, store communications traversing the system 10, store user preferences, store demographic information for the first and second users 101, 110, store information associated with any device or signal in the system 10, store information relating to usage of applications accessed by the first and second user devices 102, 111, store any information obtained from any of the networks in the system 10, store historical data associated with the first and second users 101, 110, store device characteristics, store information relating to any devices associated with the first and second users 101, 110, or any combination thereof. The user profiles may include any type of information associated with an individual (e.g. first user 101 and/or second user 110), such as, but not limited to a username, a password, contact information, demographic information, psychographic information, an identification of applications used or associated with the individual, any attributes of the individual, any other information, or a combination thereof. Device profiles may include any type of information associated with a device, such as, but not limited to, operating system information, hardware specifications, information about each component of the device (e.g. sensors, processors, memories, batteries, etc.), attributes of the device, any other information, or a combination thereof.

In certain embodiments, the database 155 may store algorithms facilitating the operation of the system 10 itself, any software application utilized by the system 10, or any combination thereof. In certain embodiments, the database 155 may be configured to store any information generated and/or processed by the system 10, store any of the information disclosed for any of the operations and functions disclosed for the system 10 herewith, store any information traversing the system 10, or any combination thereof. Furthermore, the database 155 may be configured to process queries sent to it by any device in the system 10.

In certain embodiments, the system 10 may communicate and/or interact with an external network 165. In certain embodiments, the external network 165 may include any number of servers, databases, or other componentry, and, in certain embodiments, may be controlled by a service provider. The external network 165 may also include and be connected to a cloud-computing network, a phone network, a wireless network, an Ethernet network, a satellite network, a broadband network, a cellular network, a private network, a cable network, the Internet, an internet protocol network, a content distribution network, a virtual private network, any network, or any combination thereof.

The system 10 may also include a software application or program, which may be configured to perform and support the operative functions of the system 10. In certain embodiments, the application may be a software program, a website, a mobile application, a software application, a software process, or a combination thereof, which may be made accessible to users utilizing one or more computing devices, such as first user device 102 and second user device 111. The application of the system 10 may be accessible via an internet connection established with a browser program executing on the first or second user devices 102, 111, a mobile application executing on the first or second user devices 102, 111, or through other suitable means. Additionally, the application may allow users and computing devices to create accounts with the application and sign-in to the created accounts with authenticating username and password log-in combinations. In certain embodiments, the software application may execute directly as an installed program on the first and/or second user devices 102, 111, such as a mobile application or a desktop application. In certain embodiments, the software application may execute directly on any combination of the servers 140, 150, 160.

The software application may include multiple programs and/or functions that execute within the software application and/or are accessible by the software application. For example, the software application may include an application that generates web content and pages that may be accessible to the first and/or second user devices 102, 111, any type of program, or any combination thereof.

Notably, in certain embodiments, various functions and features of the system 10 may operate without human intervention and may be conducted entirely by computing devices, robots, programs, and/or processes. For example, in certain embodiments, multiple computing devices may interact with devices of the system 10 to provide the functionality supported by the system 10.

Referring now also to FIG. 18, at least a portion of the methodologies and techniques described with respect to the exemplary embodiments of the system 10 can incorporate a machine, such as, but not limited to, computer system 1000, or other computing device within which a set of instructions, when executed, may cause the machine to perform any one or more of the methodologies or functions discussed above. The machine may be configured to facilitate various operations conducted by the system 10. For example, the machine may be configured to, but is not limited to, assist the system 10 by providing processing power to assist with processing loads experienced in the system 10, by providing storage capacity for storing instructions or data traversing the system 10, or by assisting with any other operations conducted by or within the system 10.

In some embodiments, the machine may operate as a standalone device. In some embodiments, the machine may be connected (e.g., using communications network 135, another network, or a combination thereof) to and assist with operations performed by other machines and systems, such as, but not limited to, the first user device 102, the second user device 111, the server 140, the server 150, the database 155, the server 160, or any combination thereof. The machine may assist with operations performed by other component in the system, any programs in the system, or any combination thereof. The machine may be connected with any component in the system 10. In a networked deployment, the machine may operate in the capacity of a server or a client user machine in a server-client user network environment, or as a peer machine in a peer-to-peer (or distributed) network environment. The machine may comprise a server computer, a client user computer, a personal computer (PC), a tablet PC, a laptop computer, a desktop computer, a control system, a network router, switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The computer system 1000 may include a processor 62 (e.g., a central processing unit (CPU), a graphics processing unit (GPU, or both), a main memory 1004 and a static memory 1006, which communicate with each other via a bus 1008. The computer system 100 may further include a video display unit 1010, which may be, but is not limited to, a liquid crystal display (LCD), a flat panel, a solid state display, or a cathode ray tube (CRT). The computer system 100 may include an input device 1012, such as, but not limited to, a keyboard, a cursor control device 1014, such as, but not limited to, a mouse, a disk drive unit 1016, a signal generation device 1018, such as, but not limited to, a speaker or remote control, and a network interface device 1020.

The disk drive unit 1016 may include a machine-readable medium 1022 on which is stored one or more sets of instructions 1024, such as, but not limited to, software embodying any one or more of the methodologies or functions described herein, including those methods illustrated above. The instructions 1024 may also reside, completely or at least partially, within the main memory 1004, the static memory 1006, or within the processor 62, or a combination thereof, during execution thereof by the computer system 100. The main memory 1004 and the processor 62 also may constitute machine-readable media.

Dedicated hardware implementations including, but not limited to, application specific integrated circuits, programmable logic arrays and other hardware devices can likewise be constructed to implement the methods described herein. Applications that may include the apparatus and systems of various embodiments broadly include a variety of electronic and computer systems. Some embodiments implement functions in two or more specific interconnected hardware modules or devices with related control and data signals communicated between and through the modules, or as portions of an application-specific integrated circuit. Thus, the example system is applicable to software, firmware, and hardware implementations.

In accordance with various embodiments of the present disclosure, the methods described herein are intended for operation as software programs running on a computer processor. Furthermore, software implementations may include, but are not limited to, distributed processing or component/object distributed processing, parallel processing, or virtual machine processing can also be constructed to implement the methods described herein.

The present disclosure contemplates a machine-readable medium 1022 containing instructions 1024 so that a device connected to the communications network 135, another network, or a combination thereof, can send or receive voice, video or data, and communicate over the communications network 135, another network, or a combination thereof, using the instructions. The instructions 1024 may further be transmitted or received over the communications network 135, another network, or a combination thereof, via the network interface device 1020.

While the machine-readable medium 1022 is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding or carrying a set of instructions for execution by the machine and that causes the machine to perform any one or more of the methodologies of the present disclosure.

The terms "machine-readable medium," "machine-readable device," or "computer-readable device" shall accordingly be taken to include, but not be limited to: memory devices, solid-state memories such as a memory card or other package that houses one or more read-only (non-volatile) memories, random access memories, or other re-writable (volatile) memories; magneto-optical or optical medium such as a disk or tape; or other self-contained information archive or set of archives is considered a distribution medium equivalent to a tangible storage medium. The "machine-readable medium," "machine-readable device," or "computer-readable device" may be non-transitory, and, in certain embodiments, may not include a wave or signal per se. Accordingly, the disclosure is considered to include any one or more of a machine-readable medium or a distribution medium, as listed herein and including art-recognized equivalents and successor media, in which the software implementations herein are stored.

The foregoing is provided for purposes of illustrating, explaining, and describing embodiments of this invention. Modifications and adaptations to these embodiments will be apparent to those skilled in the art and may be made without departing from the scope or spirit of this invention.

We claim:

1. A battery, comprising:
   at least one battery housing;
   at least one battery cell positioned in the at least one battery housing:
   at least one battery management system configured to control aspects of use of the battery, wherein the at least one battery management system comprises:
      at least one controller coupled to the at least one battery;
   wherein the at least one controller includes an engine start mode in which the controller permits an engine start of an engine to which the battery management system is attached even when one or more of the cells is in under voltage protection mode by temporarily suspending the under voltage protection mode to create an engine start window, thereby enabling an engine start to be attempted during the engine start window.

2. The battery management system of claim 1, wherein the controller includes a smart charger detection module configured to detect the presence of a smart charger attached directly to a battery and enable a smart charge to charge the multicell battery.

3. The battery management system of claim 1, wherein the controller includes an alert system configured to generate alerts.

4. The battery management system of claim 1, further comprising a battery charging system comprising at least one voltage regulator per battery cell.

5. The battery management system of claim 1, further comprising a cell balancing system configured to compare individual cell performance and adjust individual cells with voltages misaligned from target voltages.

6. The battery management system of claim 1, further comprising a wireless communication system enabling the battery management system to communicate with remote devices to transmit data regarding at least one cell.

7. The battery management system of claim 1, further comprising a voice control module to enable input to the battery management system be made via voice commands.

8. The battery management system of claim 1, further comprising a security system configured to secure the battery to prevent theft of a vehicle to which the battery is attached by preventing outflow of current from the battery.

9. A battery, comprising:
   at least one battery housing;
   at least one battery cell positioned in the at least one battery housing:
   at least one battery management system configured to control aspects of use of the battery, wherein the at least one battery management system comprises:
      at least one controller coupled to the at least one battery;
   wherein the at least one controller is configured to protect the battery by placing at least one battery cell of the battery in an under voltage protection mode once the controller determines a voltage of the at least one battery cell is less than or equal to an under voltage protection reference voltage; and
   wherein the controller automatically disengages the under voltage protection mode upon detection of an engine start attempt made on the battery to enable an engine start to be made.

10. The battery management system of claim 9, wherein the controller includes a smart charger detection module configured to detect the presence of a smart charger attached directly to a battery and enable a smart charge to charge the multicell battery.

11. The battery management system of claim 9, wherein the controller includes an alert system configured to generate alerts.

12. The battery management system of claim 9, further comprising a battery charging system comprising at least one voltage regulator per battery cell.

13. The battery management system of claim 9, further comprising a cell balancing system configured to compare individual cell performance and adjust individual cells with voltages misaligned from target voltages.

14. The battery management system of claim 9, further comprising a wireless communication system enabling the battery management system to communicate with remote devices to transmit data regarding at least one cell.

15. The battery management system of claim 9, further comprising a voice control module to enable input to the battery management system be made via voice commands.

16. The battery management system of claim 9, further comprising a security system configured to secure the battery to prevent theft of a vehicle to which the battery is attached by preventing outflow of current from the battery.

* * * * *